United States Patent [19]

Nussbaumer

[11] 4,118,784
[45] Oct. 3, 1978

[54] DIFFERENTIAL DFT DIGITAL FILTERING DEVICE

[75] Inventor: Henri J. Nussbaumer, LaGaude, France

[73] Assignee: International Business Machines Corporation, Armonk, N.Y.

[21] Appl. No.: 762,695

[22] Filed: Jan. 26, 1977

[30] Foreign Application Priority Data

Feb. 26, 1976 [FR] France ................. 76 05938

[51] Int. Cl.² ............................................. G06F 7/38
[52] U.S. Cl. .................................................. 364/724
[58] Field of Search ................. 235/152, 156; 364/724

[56] References Cited

U.S. PATENT DOCUMENTS

| 3,679,882 | 7/1972 | McAuliffe | 235/156 |
| 3,925,646 | 12/1975 | Richardson et al. | 235/152 |
| 4,006,351 | 2/1977 | Constant | 235/152 |

OTHER PUBLICATIONS

C. M. Rader, "Discrete Convolutions via Mersenne Transforms", *IEEE Trans. on Computers*, vol. C-21, No. 12, Dec. 1972, pp. 1269-1273.

*Primary Examiner*—David H. Malzahn
*Attorney, Agent, or Firm*—Edward H. Duffield

[57] ABSTRACT

When using the family of Discrete Fourier Transform (DFT) and Finite Field Transforms, the continuous convolution process corresponding to the filtering operation is converted into a series of finite aperiodic convolutions which are in turn computed as a series of circular convolutions by dividing the sequences to be convolved into blocks and lengthening these blocks either by appending zeros (overlap-add) or by repeating part of the sequences (overlap-save).

This causes a serious increase in the number of operations over what would have been required if the filtering process had been a true circular convolution.

This disclosure provides means for performing the filtering operation without appending any zeros and without repeating part of the sequences.

The flow of input samples is split into fixed length blocks which are simultaneously fed into two circular convolutors using different DFT's. More particularly, one convolutor operates in a conventional DFT domain, i.e., a DFT providing:

$$X_k = \sum_{n=0}^{N-1} x_n \cdot W^{nk} \quad \text{and} \quad A_k = \sum_{l=0}^{N-1} a_l \cdot W^{lk}$$

Where $x_n$ is the $n^{th}$ input signal sample and $a_l$ the $l^{th}$ filter coefficient.

The second convolutor operates in a modified DFT domain, i.e.:

$$Y_k| = \sum_{n=0}^{N-1} x_n \cdot P^n W^{nk} \quad \text{and} \quad B_k = \sum_{l=0}^{N-1} a_l \cdot R^l W^{lk}.$$

The modified convolutor provides a first series of normal terms belonging to the required filtering operation and a second series of parasitic terms multiplied by $R^N$. So long as $R^N$ is different from unity, very simple operations will remove the parasitic terms and provide the filtered sample.

8 Claims, 11 Drawing Figures

DIFFERENTIAL DFT DIGITAL FILTERING DEVICE

This invention relates to digital filtering techniques and, more particularly, to the devices with which it is possible to minimize the number of operations necessary to carry out a digital filtering operation.

Filtering a signal $x(t)$ by a filter having an impulse response designated by $h(t)$ results in a signal $y(t)$ determined by a so-called aperiodic convolution operation between these two terms, i.e., $y(t) = h(t) \, \Psi \, x(t)$ where $y(t)$ is representative of the filtered signal.

When sampled signals are to be filtered, the above operation becomes $$y_m = \sum_{n=0}^{N-1} a_n \cdot x_{m-n} \quad (A)$$

where
- $y_m$ is representative of the sample of order $m$ of the filtered signal,
- $a_n$ with $n = 0, 1, 2, \ldots$, are representations of the filter coefficients which result from a sampling operation of $h(t)$ and
- $x_{m-n}$ is representative of the sample of order $i = (m-n)$ in the signal to be filtered.

The higher the value of N, the better is the quality of the resulting filtering operation.

With reference to formula (A), it can be seen that the determination of the value of each of the samples of the filtered signal requires the carrying out of N multiplications and N-1 addition. In practice, the multiplier device is usually expensive and, also, multiplication is a comparatively long operation. Therefore, the greater the number of multiplications to be performed to determine a representation of a sample $y_m$, the slower will be the filtering operation. Also, it is to be noted that the frequency of occurrence of the samples $x_i$ at the filter input should be at least twice the highest useful frequency of the spectrum of signal $x(t)$; it can easily be understood that this slow computation considerably limits the interest in the thus involved filter for the greater precision samples, and this, more particularly, is true when the signal has to be processed in real time.

In the development of digital filters, it has, therefore, been necessary to try to overcome the above-mentioned drawbacks and many solutions have been proposed. One proposed solution is to make use of the properties of some of the mathematical transforms and, more specifically, those which belong to the family of the discrete Fourier transforms (DFT). Such transforms have an advantage in that they verify the so-called convolution theorem. In other words, when designating by $[A_K]$ and $[X_K]$ the transforms of sets $[a_n]$ and $[x_i]$, each of N terms, and by $C_K$ the terms resulting from multiplication $C_K = A_K \cdot X_K$, it has been demonstrated that the inverse transform of set $[C_K]$ supplies terms $c_m$ resulting from the convolution of the set of terms $[a_n]$ with the set of terms $[x_i]$, thereby making it possible to obtain samples $y_m$ of the desired filtered signal.

Now, the carrying out of both direct and inverse transforms requires only simple operations. More specifically, with transforms of the Mersenne or Fermat type, the only multiplications to be performed are those to supply terms $C_K$ from $A_K$ and $X_K$. It results therefrom that the number of necessary multiplications is reduced by a factor N, which is a considerable saving.

However, the use of discrete transforms entails the carrying out of periodic convolutions (the so-called circular convolutions) whereas a filtering operation requires an aperiodic convolution. In the book by Gold and Rader entitled, "Digital Processing of Signals" (Chapter 7) published by McGraw Hill Company in 1969, there is disclosed one way to convert from the first type of convolutions to the second ones by dividing the stream of samples of the signal to be filtered into sample blocks of a given length, proceeding with circular convolution operations upon said blocks and, then, combining the results of the separate blocks. In this book, the authors define more specifically two processing methods, the first one being called the "overlap-add" method, and the second one being called the "overlap-save" method. The difference between these two methods is in the manner in which the data groups are formed before being submitted to circular convolution operations and, of course, how the results of these convolutions are combined.

When making use of either of these methods in a filtering operation, the length of each sample block is fictitiously increased either by appending thereto a sequence of zero terms (overlap-add) or by repeating part of the preceding block (overlap-save). Thus, when a N-coefficient filtering operation is desired, one has to process, at least, 2N-term sequences. This requires the use of a device for carrying out 2N-term transforms. Now there is a close relationship between the length of a transform and the size of the words processed by the same. Thus, when the transform is a 2N-term transform, the devices involved are usually considerably more complex than those which are involved in the processing of N term blocks.

It is then an object of this invention to provide a digital filter for the carrying out of transforms and which requires smaller and simpler devices than those found in the prior art.

This invention will be further described, by way of a preferred embodiment, with reference to the accompanying drawings.

Figure 1:
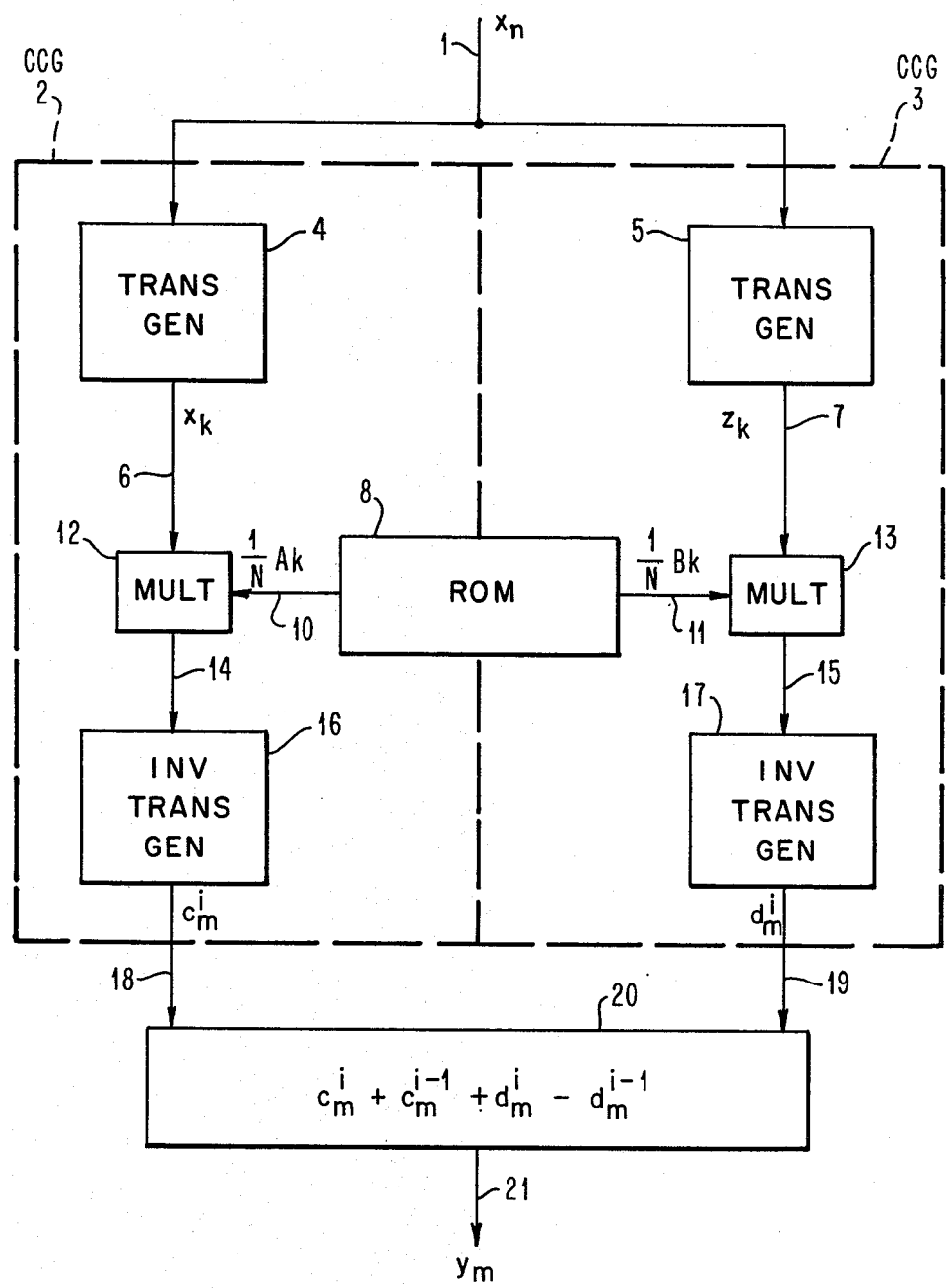
FIG. 1 is a block diagram of the preferred embodiment of the filter according to this invention.

As seen above, the use of discrete transforms of the DFT type makes it possible to perform circular convolutions. In other words, the normal transforms designated by $[A_K]$ and $[X_K]$ of successive terms $[a_l]$ and $[x_n]$ are $$A_K = \sum_{l=0}^{N-1} a_l \cdot W^{lK}$$

and $$X_K = \sum_{n=0}^{N-1} x_n \cdot W^{nK}$$

with $l, n, k = 0, 1, \ldots, N-1$.

It results therefrom that the inverse transform operation upon each of the blocks $[C_K]$ where $C_K = A_K \cdot X_K$, verifies the relationship $$c_m = \sum_{n=0}^{N-1} a_n \cdot x_{(m-n) \text{modulo } N,} \qquad (1)$$

Now, since $$(m-n)_{\text{modulo } N} = \begin{cases} m-n & \text{for } m \geq n. \\ N + (m-n) & \text{for } m < n. \end{cases}$$

expression (1) can be written:

$$c_m^i = \sum_{n=0}^{m} a_n \cdot x_{m-n} + \sum_{n=m+1}^{N-1} a_n \cdot x_{N+m-n}. \qquad (2)$$

(exponent $i$ is indicative that $c_m$ results from the processing of the $i$th block of N samples).

The first portion of expression (2) belongs to sample $y_m$ of the filtered signal whereas the second portion belongs to $y_{m+N}$. If it is possible to separate these two terms and complete them, terms $y_m$ and/or $y_{m+N}$ can be obtained.

To this end, let us suppose that the same data and coefficient blocks are also subject to a different circular convolution with a modified DFT type transform. More specifically, let us suppose that:

$$\left. \begin{array}{l} Z_K = \sum_{n=0}^{N-1} x_n \cdot R^n \cdot W^{nK} \\ \\ B_K = \sum_{q=0}^{N-1} a_l \cdot R^q \cdot W^{qK} \end{array} \right\} K = 0, 1, ..., N-1$$

Designating by $d_m$ the terms resulting from the inverse transform of $[Z_K \cdot B_K]$, there is obtained:

$$d_m = \frac{1}{N} \sum_{K=o}^{N-1} Z_K \cdot B_K \cdot R^{-m} \cdot W^{-mj}$$

$$d_m = \sum_{n=o}^{N-1} \sum_{q=o}^{N-1} a_q \cdot x_n [R^{(q+n-m)} \frac{1}{N} \sum_{k=o}^{N-1} w^{(q+n-m)K}]$$

Since the product of two DFT transforms is a DFT transform of a circular convolution, it can be seen that $q+n-m$ is operated modulo N.

When W is chosen so that $W^N = 1$, the results are that

If $(q + n - m)_{\text{modulo } N} =$ $$\alpha \neq 0, \frac{1}{N} \sum_{k=o}^{N-1} W^{\alpha K} = \frac{1}{N} \frac{1 - W^{\alpha N}}{1 - W^\alpha} = 0$$

And $d_m = 0$.

If $(q + n - m)_{\text{modulo } N} = 0 \quad q = (m - n)_{\text{modulo } N}$ and, therefore, $\frac{1}{N} \sum_{K=o}^{N-1} W^{(q + n - m)K} = 1$, then $d_m = \sum_{n=o}^{N-1} [R^{n - m + (m - n)} \text{modulo } N] a_{(m - n)_{\text{modulo } N}} x_n$ or $d_m = \sum_{n=o}^{N-1} [R^{n - m + (m - n)} \text{modulo } N] a_n x_{(m - n)_{\text{modulo } N}}$ If $m \geq n (m - n)_{\text{modulo } N} = m - n$ and $d_m = \sum_{n=o}^{m} R^Q \cdot a_n \cdot x_{m - n}.$ And if $m < n \quad (m - n)_{\text{modulo } N} = N + m - n$ so that $d_m = \sum_{n=m+1}^{N-1} R^N a_n x_{N+m-n}.$ This result can be summarized into the formula $$d_m^i = \sum_{n=o}^{m} a_n \cdot x_{m+n} + R^N \sum_{n=m+1}^{N-1} a_n \cdot x_{N+m-n}. \qquad (3)$$

The same remark that was made with respect to expression (2) can be made here, i.e., $d_m$ contains one portion which belongs to sample $y_m$, with the other portion belonging to the sample $y_{m+N}$ except for the fixed coefficient $R^N$. For the generation of the complete values of these filtered signal samples, it will, therefore, be possible to combine the processing operations of two consecutive blocks of N samples each in the signal to be filtered, such as, for instance, the $i$th and $(i-1)$th blocks.

One can write $$\left. \begin{array}{l} c_m^{i-1} = \sum_{n=o}^{m} a_n \cdot x_{m-n-N} + \sum_{n=m+1}^{N-1} a_n \cdot x_{m-n} \\ \\ d_m^{i-1} = \sum_{n=o}^{m} a_n \cdot x_{m-n-N} + R^N \sum_{n=m+1}^{N-1} a_n \cdot x_{m-n} \end{array} \right\}, \qquad (4)$$

Many values of $R^N$ can be significant since with them it is possible to obtain the desired filtered samples in a simple way. It should be noted that, for instance, R can be chosen so that $R^N = -1$. This can be obtained more particularly when $R = -1$ and use is made of the Mersenne or Fourier transforms, where N is odd and $W = 2$ or $W = e^{-j(2\pi/N)}$, respectively. But, Fourier or Fermat transforms could also be used, where N is even and $W = e^{-j(2\pi/N)}$, with $j = \sqrt{-1}$ or $W = 2$ respectively, if R is chosen so that $R^2 = W$. In that case, blocks having an even number of samples N will be used.

The representation of the $m$th sample of the filtered signal resulting from the processing of the $i$th block of N samples, namely $y_m^{iN}$, can be obtained by summing the terms $c_m^i + c_m^{i-1} + d_m^i - d_m^{i-1}.$ It is obvious that these summations can be performed in many different ways. Indeed, $(c_m^i + c_m^{i-1})$, on the one hand, and $(d_m^i - d_m^{i-1})$ on the other hand, can be grouped; in that case, the circuit performing the combination $c_m^i + c_m^{i-1} + d_m^i - d_m^{i-1}$ would be comprised of two delay elements and three adders. But the terms can be grouped otherwise, for instance, by forming $(c_m^i + d_m^i)$ and $(c_m^i - d_m^i)$; in that case, a single delay circuit operating upon $(c_m^i - d_m^i)$ would be sufficient to deduce $c_m^{i-1} - d_m^{i-1}$ therefrom.

In either case, the filter is the one shown in the block diagram in FIG. 1. In this device, the stream on circuit 1 of the samples of the signal to be filtered is divided into blocks of N consecutive samples which are applied simultaneously to two circular convolution generators (CCG) 2 and 3. These convolution generators include transform generators 4 and 5. Generator 4 produces the terms $$X_K = \sum_{n=o}^{n-1} x_n \cdot W^{nK},$$

on output 6 whereas generator 5 produces terms $$Z_K = \sum_{n=o}^{N-1} x_n \cdot R^n W^{nK}$$

on output 7.

A read only memory (ROM) 8 is utilized to store terms $(1/N)A_K$ and $1/N)B_K$ where $$A_K = \sum_{n=o}^{N-1} a_n \cdot W^{nK} \text{ and } B_K = \sum_{n=o}^{N-1} a_n \cdot R^n \cdot W^{nK},$$

wherein the coefficients $a_n$ are those of the filter function to be implemented and are presented on lines 10 and 11, respectively. Multipliers 12 and 13 receive the signals on outputs 6 and 10 and on outputs 7 and 11, respectively, to develop the terms $(1/N)A_K \cdot X_K$ and $(1/N)B_K \cdot Z_K$ which are supplied over respective outputs 14 and 15 to a first 16 and a second 17 generator generating transforms and which are the inverse of those of generators 4 and 5, respectively. The first generator 16 performs operations $$\frac{1}{N} \sum_{K=o}^{N-1} A_K \cdot X_K W^{-nK}$$

and, therefore, produces $c_m^i$ terms on output 18, whereas the second generator 17 generates terms $d_m^i$ on its output 19 by performing operations $$\frac{1}{N} \sum_{K=o}^{N-1} B_K \cdot Z_K R^{-m} W^{-mK}.$$

Terms $c_m^i$ and $d_m^i$, then, are introduced into combining device 20 which will generate the terms $2y_m$ on output 21 by performing the summation $$2y_m = (c_m^i + c_m^{i-1} d_m^i - d_m^{i-1}) \quad (5)$$

In practice, the terms $A_K/2N$ and $B_K/2N$ will be stored in ROM 8 so that the output will be the terms of $y_m$ and not $2y_m$.

Figure 1A:
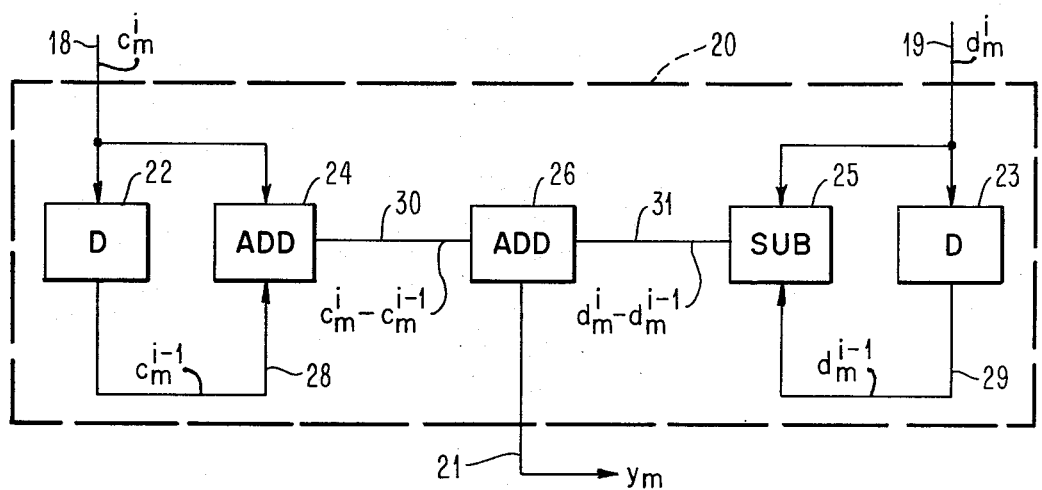
FIGS. 1A and 1B illustrate details of the blocks of FIG. 1.

Circuit 20 can be implemented according to the schematic diagram shown in FIG. 1A. It would, in this case, be comprised of two delay elements 22 and 23, each having a delay equivalent to the transfer time of one block of N terms, $c_m$ or $d_m$, two adders (ADD) 24 and 26 and one subtractor (SUB) 25. When the inputs of delays 22 and 23 are receiving $c_m^i$ and $d_m^i$, respectively, the outputs thereof on lines 28 and 29 will be producing $c_m^{i-1}$ and $d_m^{i-1}$. Adder circuit 24 and subtractor 25 will produce terms $c_m^i + c_m^{i-1}$ and $d_m^i - d_m^{i-1}$, on outputs 30 and 31, respectively, and adder 26 will produce the terms $y_m$ on output 21.

Figure 1B:
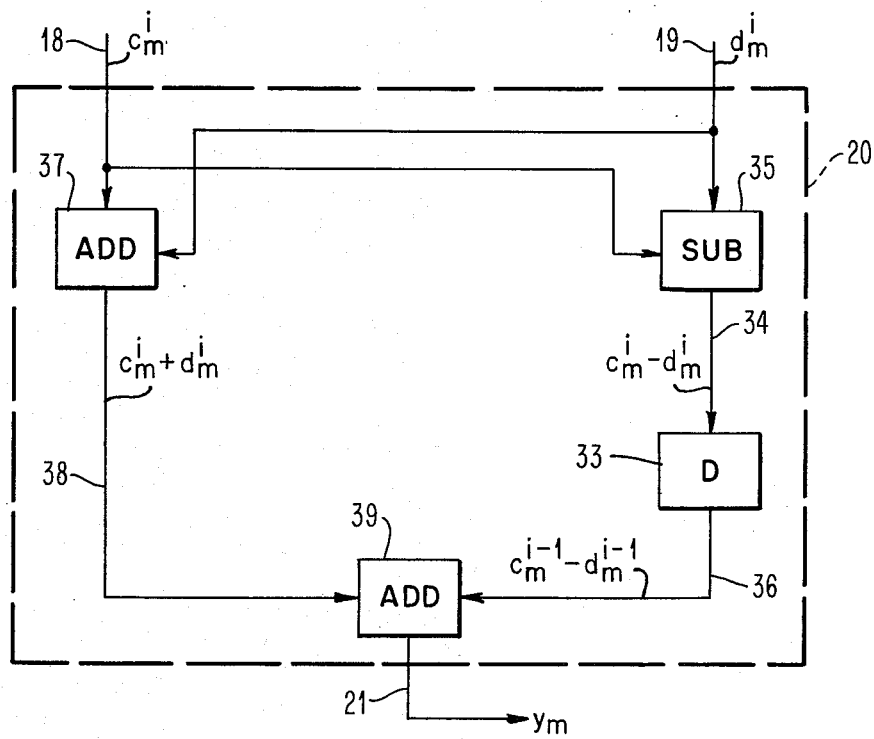

However, other circuits equivalent to the circuit shown in FIG. 1A could also be utilized. FIG. 1B schematically illustrates a combining device 20 which is comprised of a single delay element 33; this element delays the terms $c_m^i - d_m^i$ supplied to its input 34 by a subtractor 35 receiving the input terms $c_m^i$ and $d_m^i$ on its plus and minus inputs, respectively. The output 36 of delay 33 carries the terms $c_m^{i-1} - d_m^{i-1}$. The $c_m^i$ and $d_m^i$ inputs are also supplied to an adder 37 whose output 38 is combined with output 36 in another adder 39 to provide the terms $y_m$ on output 21.

Other equivalent forms exist. For instance, it can be shown that, because of the fact that some operations can be permuted, some elements of combining circuit 20 can be brought into the data flow before the carrying out of the transforms. When so placed, the structure of the filter will resemble that shown in FIG. 2. The samples of the signal to be filtered on input line 1 are delayed by the time of one block of signals in delay unit 41. The output terms $x_n$ on output 42 are then combined additively in adder 43 and subtractively in subtractor 44 to form the series $X_n = x_n + x_{n+N}$ and series $Z_n = x_{n+N} - x_n$. Data blocks $[X_n]$ and $[Z_n]$ on outputs 45 and 46 are introduced into circular convolution generators 2 and 3, respectively, as in FIG. 1, one performing the so-called normal transform operation in generator 4 and the other one performing the so-called modified transform operation in generator 5. The convolution generators 2 and 3 are also comprised of multipliers 12 and 13 and the inverse transform generators 16 and 17 of the normal and modified types, respectively. For this structure, it is then sufficient to add term-to-term the outputs of CCG 2 and CCG3 on outputs 18 and 19 in an adder 47 to obtain samples $y_m$ of the filtered signal.

Furthermore, when R is chosen as equal to $-1$, expression (5) can also be written:

$$Y_m = \frac{1}{2N} \sum_{K+o}^{N-1} [X_K^i \cdot A_K^i + X_K^{i-1} \cdot A_K^{i-1} + \quad (6)$$
$$(-1)^{-m} B_K^i \cdot Z_K^i - (-1) - m B_K^{i-1} Z_K^{i-1}] W^{-nK}$$

where $i$ is representative of the index of the data block to which the terms correspond.

Since the sign of $(-1)^m$ is independent of K, the operations $$[X_K^i \cdot A_K^i + X_K^{i-1} A_K^{i-1} + (-1)^m B_K^i \cdot Z_K^i - (-1)^m B_K^{i-1} \cdot Z_K^{i-1}]$$

can be performed before proceeding to the inverse transform.

Figure 2:
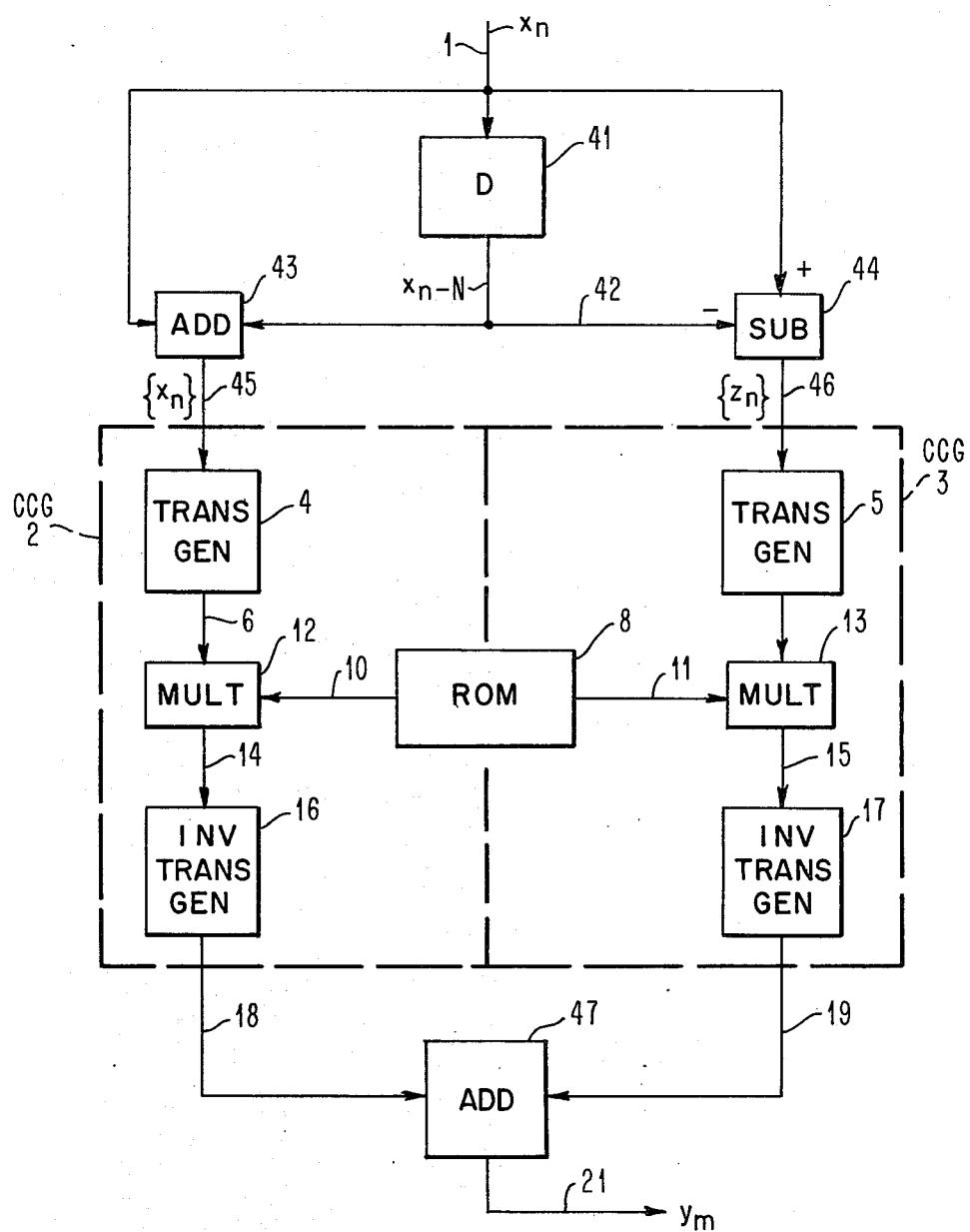
FIGS. 2, 3 and 4 are other embodiments of this invention.
Figure 3:
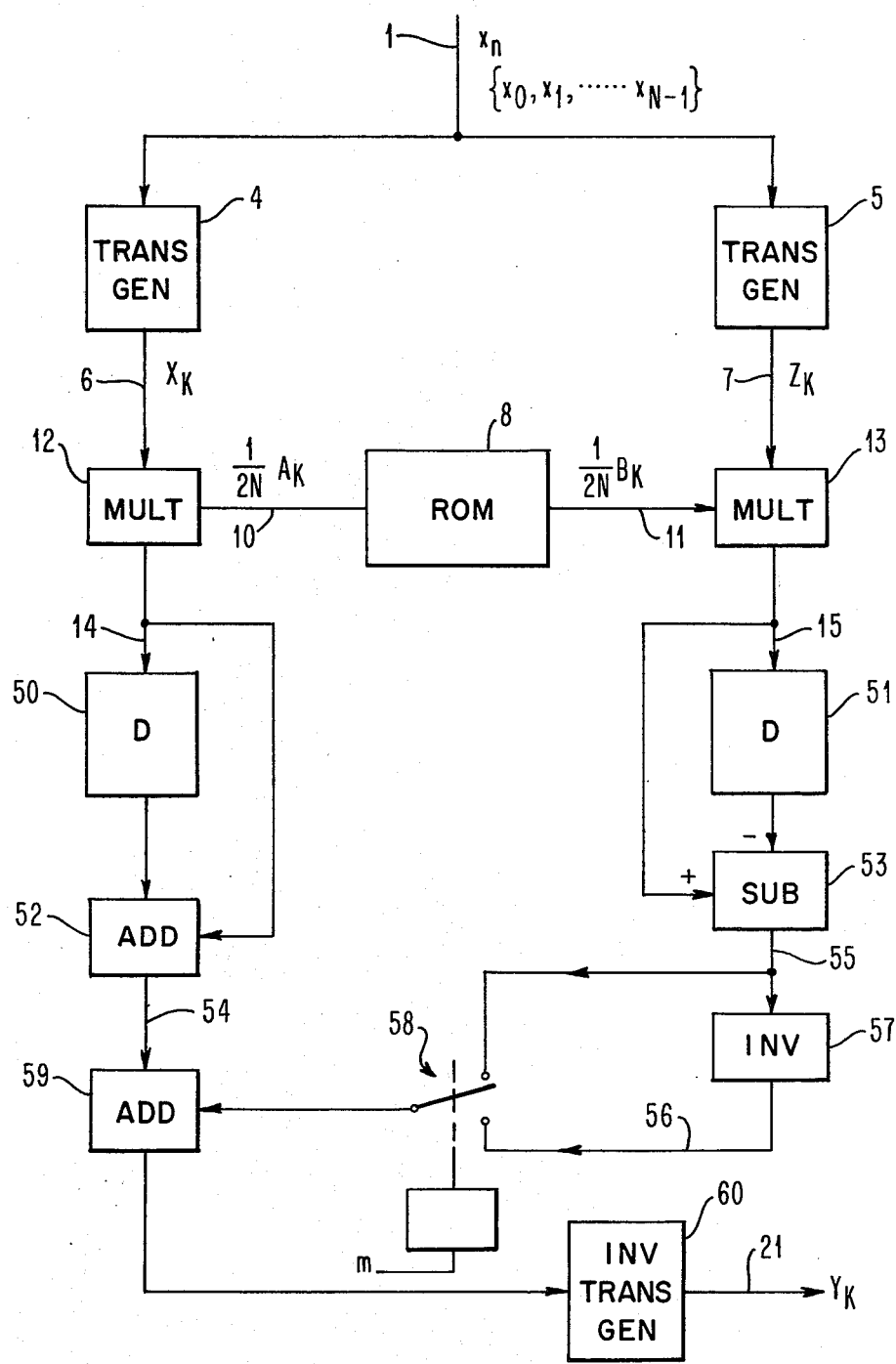

The structure of the schematic diagrams shown in FIGS. 1 and 2 can, therefore, be simplified so as to be comprised of a single inverse transform generator. This elimination of an inverse transform generator requires the addition of only one inverter and one switch, as shown in the diagram of FIG. 3 which is derived from FIG. 1. The device shown in this figure is similar to the upper half of FIG. 1 and includes the input 1 to which the samples $x_n$ are applied in blocks of N terms. These blocks are simultaneously sent to the two transform generators 4 and 5, generating $X_K$ and $Z_K$, respectively. The terms so obtained are introduced into multipliers 12 and 13 which also receive terms $(1/2N)A_K$ and $(1/2N)B_K$ from a ROM 8 and supply $(1/2N)A_K^j X_K^j$ and $(1/2N)B_K^j Z_K^j$, on outputs 14 and 15, respectively, when the sample block of order $i$ is processed. The use of delay circuits 50 and 51 each providing an output delay equivalent to the processing time of one sample block will enable the present output on line 14 to be additively combined with the delayed output from delay 50 in adder 52 and the output on line 15 to be subtractively combined with the output of delay 51 in subtractor 53 to provide the terms $$\frac{1}{2N} [A_K^i X_K^i + A_K^{i-1} X_K^{i-1}]$$

at the output 54 of adder 52 and the terms $$\frac{1}{2N} [B_K^i Z_K^i - B_K^{i-1} Z_K^{i-1}]$$

at the output 55 of subtractor 53

The terms coming from subtractor 53 are taken either directly from output 55 or are taken from the output 56 of an inverter 57 receiving output 55, according to whether the $m$ parameter of the sample $y_m$ to be generated is even or odd. The selection is made by the switch 58 controlled by the factor $m$ and the output of switch 58 is one input of an adder 59 which also receives the output of adder 52. The output of adder 59 is the input of an inverse transform generator 60 whose output on line 21 is the desired samples $y_m$.

It is possible to simplify this filter even more when $R = -1$, for then $$\frac{X_K + Z_K}{2} = \sum_{n=o}^{\frac{N-1}{2}} x_{2n} W^{2nK}$$

and $$\frac{X_K - Z_K}{2} = \sum_{n=o}^{\frac{N-3}{2}} x_{2n+1} W^{(2n+1)K}$$

Figure 4:
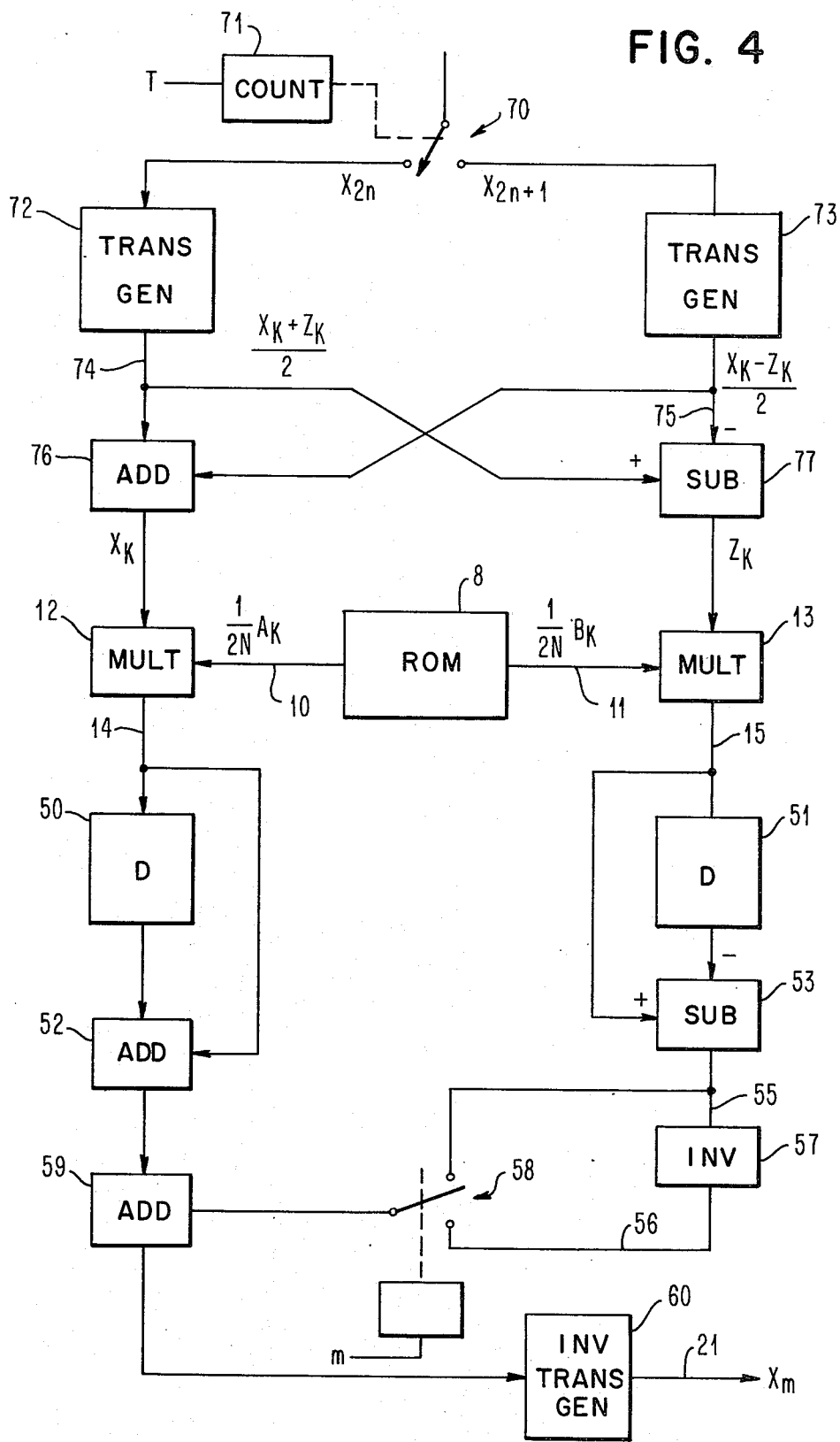

Under those conditions, transform generators 4 and 5 need only half the required working power when connected according to the schematic diagram shown in FIG. 4. This device includes a switch 70 controlled by a counter 71 which sends the even order of samples $x_{2n}$ in each block of samples to transform generator 72, which generates on its output 74 the terms $$\sum_{n=o}^{\frac{N-1}{2}} x_{2n} W^{2nK}, \text{ i.e. } \frac{X_K + Z_K}{2}$$

and sends the odd order samples $x_{2n+1}$ to transform generator 73 which generates on its output 75 the terms $$\sum_{n=o}^{\frac{N-3}{2}} x_{2n+1} W^{(2n+1)K}, \text{ i.e. } \frac{X_K - Z_K}{2}$$

An adder 76 is connected to sum the outputs of generators 72 and 73 to produce $$X_K = \frac{X_K + Z_K}{2} + \frac{X_K - Z_K}{2},$$

Similarly, a subtractor 77 is connected to the outputs of generators 72 and 73 to subtractively combine the outputs to produce $$Z_K = \frac{X_K + Z_K}{2} - \frac{X_K - Z_K}{2}.$$

These $X_K$ and $Z_K$ are the same as the output terms of transform generators 4 and 5 of FIG. 3 and they are further processed in the same manner.

The rest of the device of FIG. 4 is in every respect similar to the lower part of the device shown in FIG. 3. It can, therefore, be seen that the computing power necessary in generators 72 and 73 need be only half of that required in generators 4 and 5.

Figure 5:
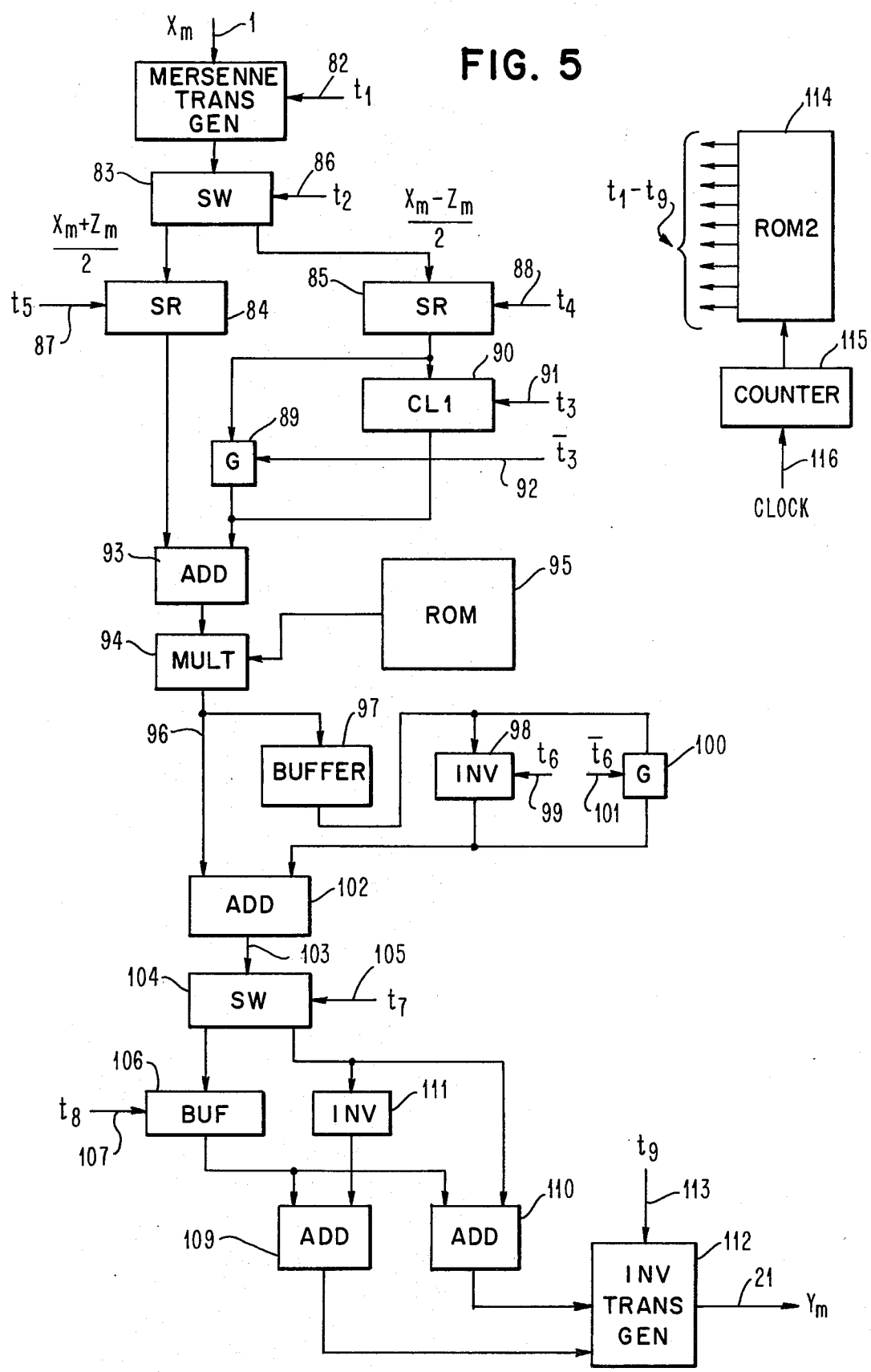
FIGS. 5, 6 and 7 illustrate details taken from FIG. 4.

The filter illustrated in FIG. 4 can be implemented in many different ways and, more specifically, a preferred embodiment can be designed as diagrammed in FIG. 5, where it has been assumed that the utilized transform generators are of the Mersenne type. The device shown in FIG. 5 includes a transform generator 81 which receives samples $x_n$ on line 1 and which acts, alternatively as the transform generators 72 or 73 of FIG. 4 as controlled by the state of the synchronization signal $t_1$ on line 82, i.e., as signal $t_1$ assumes a logic level "1" or "0." For a logic level of "1", generator 81 will produce the terms $$\frac{X_K + Z_K}{2}$$

and for logic level "0," it will produce the terms of $$\frac{X_K - Z_K}{2}.$$

These terms will be supplied to a switch 83 in the following order $$\frac{X_0 + Z_0}{2}, \frac{X_0 - Z_0}{2}, \frac{X_1 + Z_1}{2}, \frac{X_1 - Z_1}{2}, ...,.$$

These output terms are alternatively switched by a $t_2$ control signal on line 86 into either shift register 84 of a length corresponding to two words, or into one word long shift register 85. The data flow through shift registers 84 and 85 is under the control of timing signals $t_4$ and $t_5$, respectively, on lines 87 and 88. The term in register 85 may be sent either directly through a gate 89 or inversely through an inverter 90 under the control of a timing signal $t_3$ on a line 91 or $t_3$ on a line 92, into adder 93 which is operating modulo $2^N - 1$. The output of adder 93 is alternately the term $X_K$ or term $Z_K$ and these terms are sent to multiplier 94 which, also alternately receives the terms of $(1/2N)A_K$ and $(1/2N)B_K$ from a ROM 95 and alternately generates the terms of $(1/2N)A_K X_K$ and $(1/2N)B_K Z_K$ on its output 96. The terms coming from multiplier 94 are delayed in a buffer 97 for a time corresponding to one block. The use of an inverter 98 controlled by timing signal $t_6$ on line 99 and a gate 100 controlled by signal $t_6$ on line 101 makes it possible to enter the delayed term from buffer 97 either inversely or true into an input of a modulo, $2^N - 1$ adder 102 to be added to the term on line 96 to generate the terms $$\frac{1}{2N} (A_K^i X_K^i + A_K^{i-1} X_K^{i-1}) \text{ and}$$

$$\frac{1}{2N} (B_K^i Z_K^i - B_K^{i-1} Z_K^{i-1})$$

alternatively. The terms coming from adder 102 on line 103 are sent through a switch 104 controlled by a timing signal $t_7$ on a line 105 to an assembly comprised of one word length shift register 106 controlled by timing signal $t_8$ on a line 107 to feed a one word length delayed term to an input of modulo $2^N-1$ adders 109 and 110 or alternately, directly from switch 104 to another input of adder 110 and complementally through an inverter 111 to the other input of adder 109. These adders 109 and 110 generate the terms $$\frac{1}{2N}(A_K^i X_K^i + A_K^{i-1} X_K^{i-1} + B_K^i Z_K^i - B_K^{i-1} Z_K^{i-1})$$

and $$\frac{1}{2N}(A_K^i X_K^i + A_K^{i-1} X_K^{i-1} - B_K^i Z_K^i + B_K^{i-1} Z_K^{i-1}),$$

respectively. The samples $y_m$ of the filtered signal on line 21 are then generated by inverse transform generator 112, similar to generator 81, controlled by timing signal $t_9$ on line 113 and receiving the outputs of adders 109 and 110.

The timing signals $t_1$ through $t_9$ are provided by a ROM 114 addressed by a counter 115 driven by a clock signal on a line 116.

Generator 81 must carry out operations of the type $$\sum_{n=0}^{\frac{N-1}{2}} x_{2n} \cdot 2^{2nK} \text{ and } \sum_{n=0}^{\frac{N-3}{2}} x_{2n+1} \cdot 2^{(2n+K)},$$

since it has been assumed that the utilized transforms were of the Mersenne type. Therefore, the simple thing to do would appear to consist in weighting each sample by the corresponding powers of two, which, in the binary form, necessitates bit order shifts only, and accumulating the so-weighted terms. It is, however, more economical to proceed otherwise.

In the Mersenne transforms, N is a prime number, and the exponents of $W=2$ are taken modulo this prime number N. Therefore, when K varies from 0 to $N-1$, the exponents of W assume each of the integral values from 0 to $N-1$ only once. A single multiplication-by-two circuit, therefore, can be used. Let us suppose, for instance, that sample blocks are to be processed wherein $N=5$. The transforms will be performed modulo $p=2^5-1$ and the exponents of W will be chosen modulo 5. It results therefrom that $$X_0 = x_0 + x_1 \cdot 2^0 + x_2 \cdot 2^0 + x_3 \cdot 2^0 + x_4 \cdot 2^0$$
$$X_1 = x_0 + x_1 \cdot 2 + x_2 \cdot 2^2 + x_3 \cdot 2^3 + x_4 \cdot 2^4$$
$$X_2 = x_0 + x_1 \cdot 2^2 + x_2 \cdot 2^4 + x_3 \cdot 2 + x_4 \cdot 2^3$$
$$X_3 = x_0 + x_1 \cdot 2^3 + x_2 \cdot 2 + x_3 \cdot 2^4 + x_4 \cdot 2^2$$
$$X_4 = x_0 + x_1 \cdot 2^4 + x_2 \cdot 2^3 + x_3 \cdot 2^2 + x_4 \cdot 2$$

$$\frac{X_o + Z_o}{2} = x_o + x_2 + x_4$$
$$\frac{X_o - Z_o}{2} = x_1 + x_3$$
$$\frac{X_1 + Z_1}{2} = x_o + x_2 \cdot 2^2 + x_4 \cdot 2^4$$
$$\frac{X_1 - Z_1}{2} = x_1 \cdot 2 + x_3 \cdot 2^3$$
$$\frac{X_2 + Z_2}{2} = x_o + x_2 \cdot 2^4 + x_4 \cdot 2^3$$
$$\frac{X_2 - Z_2}{2} = x_1 \cdot 2^2 + x_3 \cdot 2$$
$$\frac{X_3 + Z_3}{2} = x_o + x_2 \cdot 2 + x_4 \cdot 2^2$$
$$\frac{X_3 - Z_3}{2} = x_1 \cdot 2^3 + x_3 \cdot 2^4$$

-continued $$\frac{X_4 + Z_4}{2} = x_o + x_2 \cdot 2^3 + x_4 \cdot 2$$
$$\frac{X_4 - Z_4}{2} = x_1 \cdot 2^4 + x_3 \cdot 2^2$$

It can be observed that the powers of 2, namely $2^0, 2^1, 2^2, 2^3$, and $2^4$ are sequentially assigned to weight the terms $X_K$ in the $X + Z$ terms as follows:

$$\frac{X_0 + Z_0}{2}, \frac{X_1 + Z_1}{2}, \frac{X_2 + Z_2}{2}, \frac{X_3 + Z_3}{2}, \text{ and}$$

$$\frac{X_4 + Z_4}{2} \text{ for term } x_o$$

$$\frac{X_0 - Z_0}{2}, \frac{X_1 - Z_1}{2}, \frac{X_2 - Z_2}{2}, \frac{X_3 - Z_3}{2}, \text{ and}$$

$$\frac{X_4 - Z_4}{2} \text{ for term } x_1$$

$$\frac{X_0 + Z_0}{2}, \frac{X_3 + Z_3}{2}, \frac{X_1 + Z_1}{2}, \frac{X_4 + Z_4}{2}, \text{ and}$$

$$\frac{X_2 + Z_2}{2} \text{ for term } x_2$$

$$\frac{X_0 - Z_0}{2}, \frac{X_2 - Z_2}{2}, \frac{X_4 - Z_4}{2}, \frac{X_1 - Z_1}{2}, \text{ and}$$

$$\frac{X_3 - Z_3}{2} \text{ for term } x_3$$

$$\frac{X_0 + Z_0}{2}, \frac{X_4 + Z_4}{2}, \frac{X_3 + Z_3}{2}, \frac{X_2 + Z_2}{2}, \text{ and}$$

$$\frac{X_1 + Z_1}{2} \text{ for term } x_4$$

Figure 6:
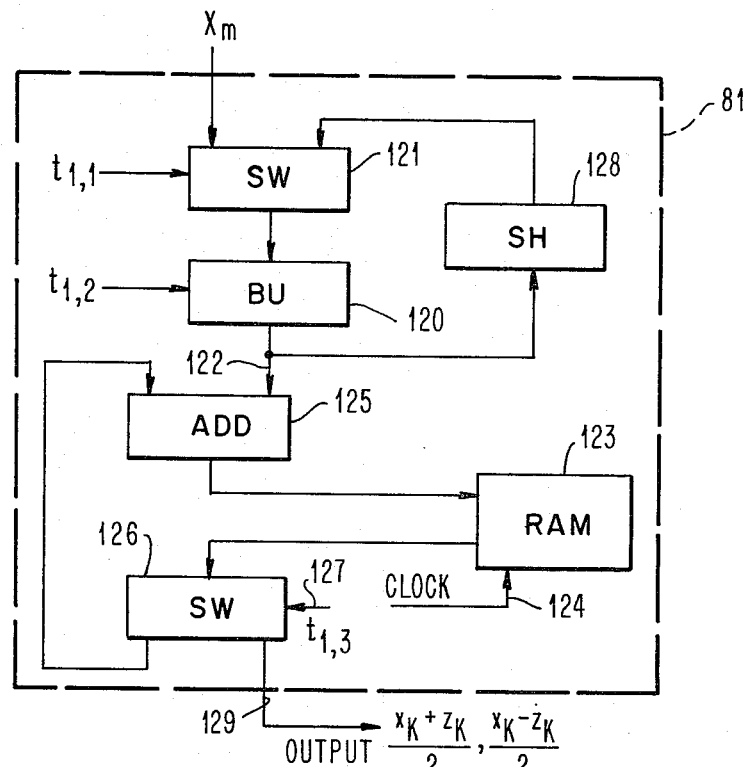

The Mersenne transform 81 can, therefore, be implemented according to the schematic diagram in FIG. 6. The samples $x_n$ of the signal to be filtered on input 1 are introduced into a one-word capacity buffer memory 120, through a switch 121. They are sent from output 122 of buffer 120 to those storage locations in a random access memory (RAM) 123 which store terms $$\frac{X_K \pm Z_K}{2}$$

Ram 123 has a storage location for each term and the terms are read out in a predetermined order by clock pulses on line 124. The first terms read out will be those which contain the value $x_n$ and the $x_n$ value will be entered on the RAM's write cycle through an adder 125. On later read out cycles, the stored value in RAM 123 will be passed through switch 126 by timing signal $t_{1,3}$ on line 127 to a second input of adder 125 where it will be combined with a later weighted value of $x_n$. After all of the unweighted $x_n$ have been entered into locations of RAM 123, the $x_n$ is sent from buffer 120 to shifter 128 where it is doubled by shifting its bits by one position leftward and the doubled $x_n$ is reinserted into buffer 120 through switch 121. The value $2x_n$ is then added in adder 125 to the contents of those storage locations in RAM 123 which are to receive it. The procedure goes on this way until all the terms $$\frac{X_K \pm Z_K}{2}$$

are formed in RAM 123 and these terms are then read from RAM 123 through switch 126 to output line 129 in the following order $$\frac{X_K + Z_K}{2}, \quad \frac{X_K - Z_K}{2}.$$

Figure 7:
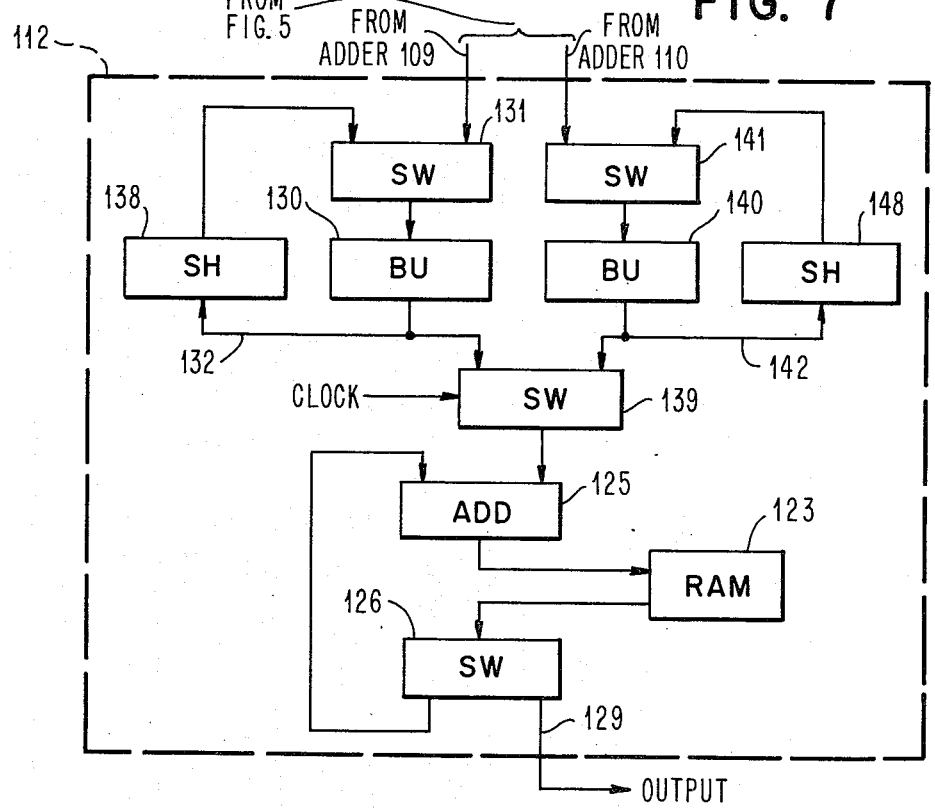

Inverse transform generator 112 of FIG. 5 is similar to generator 81 in principle but it has two inputs, one coming from adder 109 and the one one, from adder 110. Elements 121, 128, and 121 of FIG. 6 must, therefore, be duplicated, as shown in FIG. 7. The output of adder 109, FIG. 5, is set to switch 131, buffer 130 and shifter 138 for doubling whereas the output of adder 110 drives similar switch 141, buffer 140 and doubling shifter 148. The outputs 132 and 142 of buffers 130 and 140 are alternate inputs to an adder similar to adder 125, FIG. 5, through a switch 139. The rest of the inverse transform generator 112 is comprised of elements similar to RAM 123 and switch 126 as shown in FIG. 6.

It has been shown above that a comparatively simplified digital filter could be designed for dealing with blocks of samples, which blocks are not artificially lengthened. This is done by the processing of said blocks of samples through two parallel channels, each of which performs a different circular convolution. To this end, one of the channels operates according to a normal DFT type transform, and the other one operates with a modified transform operation of the type:

$$Z_K = \sum_{n=0}^{N-1} x_n \cdot R^n W^{nK}.$$

When combining the terms given by the two circular convolutions, it has been shown that the desired filtered signal samples may be obtained in association with parasitic terms. It has also been shown that these parasitic terms could be eliminated by a judicious choice of parameter R. By way of example, the case with $R^N = -1$ has been mentioned. It is obvious that other parameters R can be chosen but their usefulness will depend on the complexity of the combination circuits of the two circular convolutions required. In the particular case of the Fourier transforms, an interesting choice is to use $R = 2^{1/N}$ for, then, RN will assume a simple value with $R^N = 2$ and the multiplications by the powers of R are multiplications by real numbers whereas when choosing $R = W^{1/2}$, the multiplications by powers of R are multiplications by complex numbers.

It may, sometimes, be of interest to combine more than two simultaneous circular convolutions for the filtering operation. By way of example, let us suppose that two modified circular convolutions, one with $R^N = -1$, the other one with $R^N = j$, where $j = (-1)^{1/2}$, are performed on each of the blocks. For the latter, transforms in the form $$Y_K = \sum_{n=0}^{N-1} x_n W^{n/4} W^{nK} \text{ and } U_K = \sum_{n=0}^{N-1} a_n W^{n/4} W^{nK}$$

can be chosen.

Figure 8:
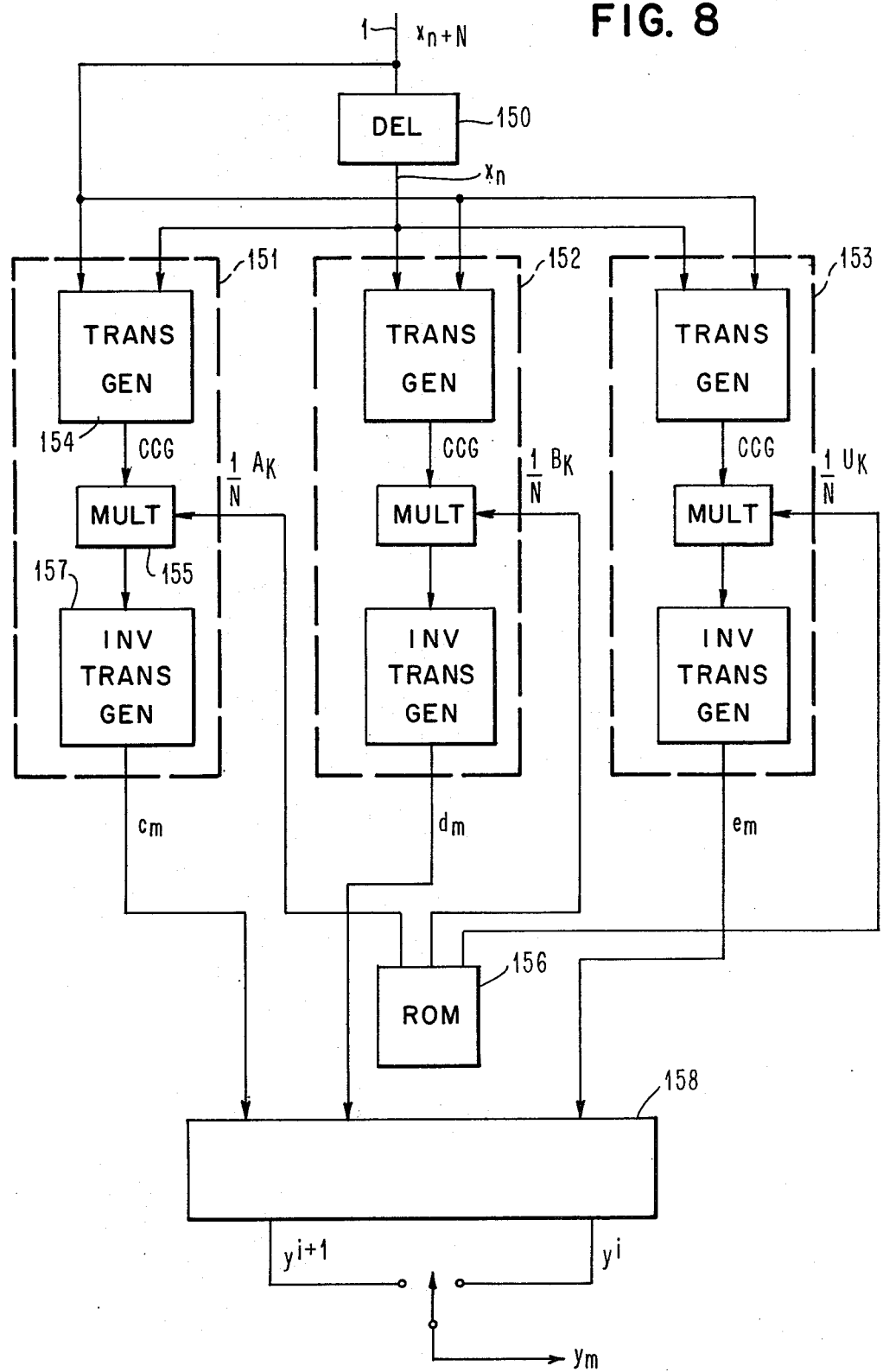
FIG. 8 is another embodiment of this invention.

By defining terms $X_k$, $Z_K$ and $Y_K$ as being the transforms of terms $[x_{n+N} + X_n]$, $[x_{n+N} - x_n]$ and $[x_{n+N} - jx_n]$, respectively, one is able to develop the digital filter shown schematically in FIG. 8. Samples $x_n$ on input 1 are delayed by the time for one block of samples, namely by N sample times in delay 150 so that samples $x_n$ and $x_n + N$ can be utilized simultaneously. These terms are simultaneously introduced into three circular convolution generators 151, 152 and 153. Generator 151 is comprised of a normal transform generator 154 which generates the terms $$X_K = \sum_{n=0}^{N-1} (x_{n+N} + x_n) W^{nK},$$

multiplier 155 which receives the above terms and also receives terms $(1/2N)A_K$, from a ROM 156 and an inverse transform generator 157 which generates the terms $$c_m = \frac{1}{2N} \sum_{K=0}^{N-1} A_K \cdot X_K \cdot W^{-mK}.$$

from the output terms of multiplier 155.

The other generators are built in a somewhat similar way to that of generator 154 with the exception that generator 152 makes use of a first modified transform function with a parameter $R^n$ such that $R^N = -1$, and produces terms $d_m$ whereas generator 153 makes use of a second modified transform function with a parameter $R^n$ such that $R^N = j$ and produces terms $e_m$. The outputs of these three circular convolution generators are then combined together in circuits 158 in order to give the terms of $$y_m^{i+1} = \frac{c_m^i + d_m^i}{2} \quad (7)$$

$$y_m^i = \frac{1}{4}[2j(e_m^i - d_m^i) + (1-j)(c_m^i - d_m^i) - 2j(e_m^{i-2} - d_m^{i-2}) + (1+j)(c_m^{i-2} - d_m^{i-2})] \quad (8)$$

NC - ROM Coefficient memory 156 can be common to the three convolution generators to which it supplies the normal transforms ($A_K$) or the modified transforms ($B_K$ and $U_K$) of the filter coefficients $[a_n]$.

Thus, it can be observed that from the terms produced by the three circular generators 151, 152, and 153 two consecutive blocks of N samples of the filtered signal can be obtained, as shown in FIG. 8 where terms $c_m$, $d_m$, and $e_m$ are combined to supply samples $y^i$ and $y^{i+1}$, consecutively.

Figure 8A:
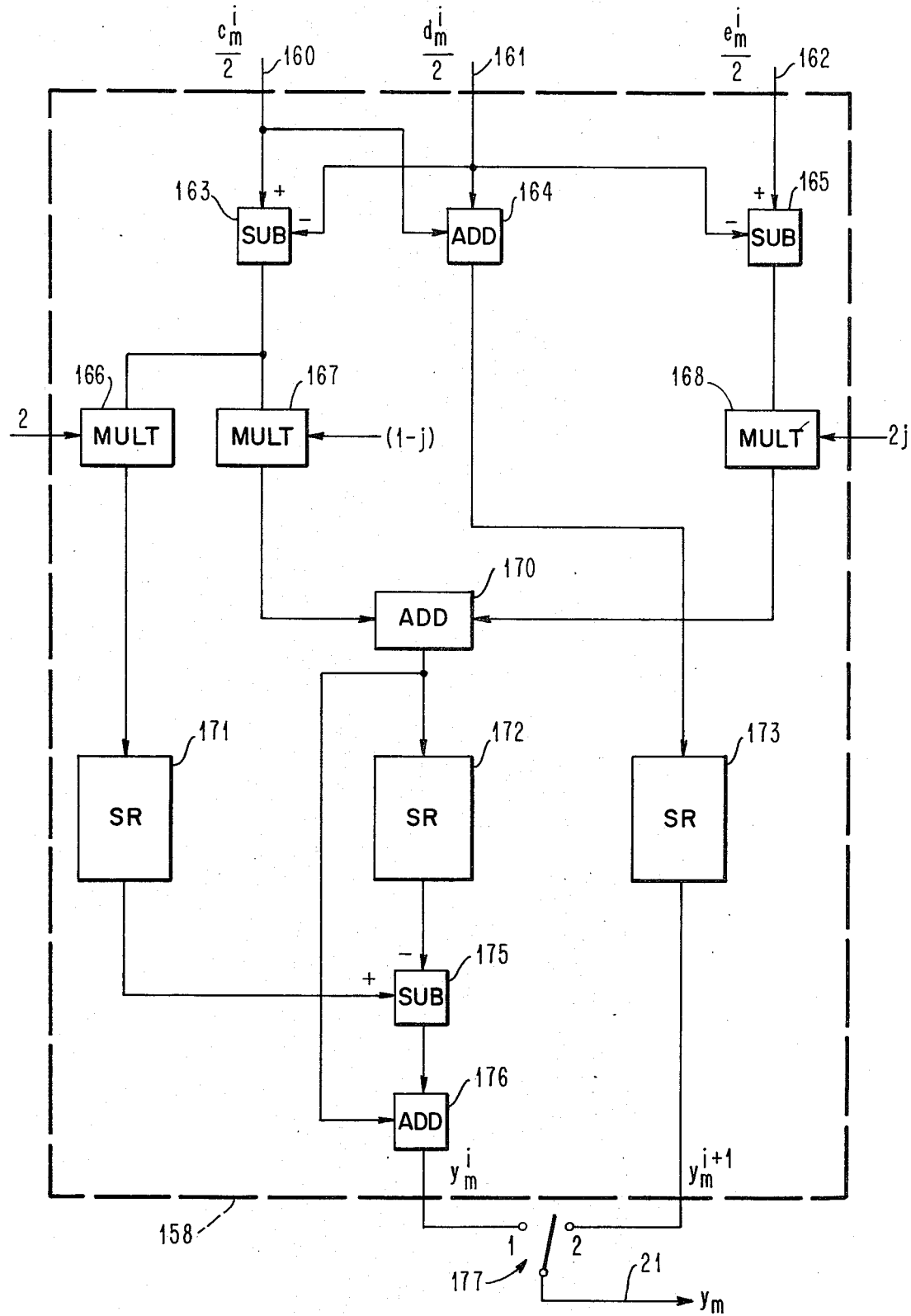
FIG. 8A illustrates details of structure of a block of FIG. 8.

Of course, this filtering approach is of practical interest only if the combining circuits 158 performing operations (7) and (8) can be implemented in a simple manner. This can be the case when the transforms to be implemented are of the so-called Fermat type. The transform coefficient W can be advantageously chosen equal to four and each of the operations will be performed modulo $2^q + 1$ with $q = 2^t$. In that case, the factor R utilized in transform generator 152 will be chosen equal to $W^{1/2} = 2$, whereas the factor utilized in transform generator 153 will be $W^{1/4} = 2^{1/2}$. But the Fermat transform is of even greater interest since the factor $j$, where $j = (-1)^{1/2}$, has a real value in the corresponding digital system. Indeed, $(2^q)$ modulo $2_{q+1} = -1$, whence $j = 2^{q/2} = 2^{2t-1}$. This makes it possible to have no discrimination between the real and imaginary portions of the terms processed in combining circuit 158, which considerably simplifies this device. FIG. 8A illustrates an embodiment of circuits 158. It is assumed for this circuit that the terms produced by the circular convolution generators of the device shown in FIG. 8 are $c_m^i/2$, $d_m^i/2$, and $e_m^i/2$.

The divisions by two can be obtained by halving the coefficient terms before they are stored in ROM 156 or by a one order shift to the right of the binary value representations of the output terms. Term $c_m^i/2$ on input 160 is simultaneously applied to the additive input of a subtractor 163 and to an input of adder 164. Term $d_m^i/2$ on input 161 is simultaneously applied to the other input of adder 164 and to the subtractive inputs of subtractor 163 and a second subtractor 165. Term $e_m^i/2$ on input 162 is applied to the additive input of subtractor 165. The output of subtractor 163 is multiplied by two in a multiplier 166 and by $(1-j)$ in a multiplier 167, whereas the output of subtractor 165 is multiplied by $2j$ in a multiplier 168. The outputs of multipliers 167 and 168 are added together in an adder 170. The outputs of multiplier 166, adder 170 and adder 164 are transmitted to shift registers 171, 172, and 173, respectively, to introduce a delay corresponding to two blocks of terms in shift registers 171 and 172 and to one block in shift register 173. The output of shift register 172 is subtracted from that of register 171 in a subtractor 175 whose output is added to the output of adder 170 in an adder 176. The outputs of adder 176 and shift register 173 are connected to a two-position switch 177. When in position 1, the switch 177 supplies to output 21 terms $y_m^i$ which result from the processing of the ith block of N samples and in position 2, it supplies terms $y_m^{i+1}$ which result from the processing of the following block.

It is to be understood that the preceding description has been given as a preferred embodiment only and that numerous alterations can be developed without departing from the scope of this invention as set out in the following claims.

What is claimed is:

1. A filtering device for filtering a signal $x(t)$ which is represented in the form of digitally expressed samples $x_n$, said device performing a filtering function defined by a set of digital coefficients $[a_n]$, and characterized in that it includes:
    a. an input means to which said samples $x_n$ are applied,
    b. splitting means connected to said input means and separating the stream of said samples $x_n$ into blocks of predetermined length,
    c. at least two circular convolution function generators, each receiving said blocks of samples and signals representing said set of coefficients and performing circular convolutions between each of said blocks and said set of coefficients, making use of one function generator operating according to the so-called normal discrete Fourier transform and the other one or more function generators operating according to modified discrete Fourier transform functions, and
    d. combination means responsive to all said function generators for combining the outputs of said generators to generate signals representing samples of the desired filtered signal.

2. A filtering device as set out in claim 1 for filtering a signal wherein to each of said circular convolution function generators is associated a block of read only memory storing said set of digital coefficients $[a_n]$ as modified by the one of said normal transform or said modified transform used for the transformation of the block of signals entered into said circular convolution generator and further includes means for combining corresponding ones of said set of transformed coefficients with the transforms of said entered block of signal samples.

3. A filtering device for filtering a signal $x(t)$ as set out in claim 1, said filtering device being further characterized in that it includes three circular convolution function generators, one such generator performing a normal DFT transform on its input terms and the remaining generators performing different modified Fermat transforms on their input terms.

4. A filtering device for filtering a signal $x(t)$ appearing in the form of consecutive digitally represented samples $x_n$, said filtering device including:
    a. an input means receiving said samples $x_n$,
    b. splitting means in said input means to separate said stream into sample blocks of a constant length,
    c. a pair of circular convolution generators designated first and second circular convolution generators, respectively, each of said circular convolution generators receiving said sample blocks and each of said circular convolution generators comprising a discrete transform generator, one of said discrete transform generators being included in said first circular convolution generator and performing a normal DFT type transform and the other of said discrete transform generators included in said second convolution generator and performing a modified DFT type transform,
    d. a storage means for storing both the normal transform and the modified transform of a set of digitally represented coefficients defining the desired filtering function,
    e. a multiplication means in each said circular convolution generator for multiplying term-by-term the terms supplied by said storage means with corresponding terms of those supplied by each of said discrete transform generators,
    f. an inverse transform generator in each said circular convolution generator to perform on the output terms of the associated multiplication means, a transform which is the inverse of that performed by the associated discrete transform generator connected to its said multiplication means,
    g. a delay means connected to the output of each of said inverse transform generators,
    h. a first addition means for adding the input and output of the said delay means connected to said output of said inverse transform generator associated with said discrete transform generator for said normal DFT transform,
    i. a first subtraction means for subtracting the output of said delay means connected to said output of said inverse transform generator associated with said discrete transform generator for said modified DFT transform from its input term, and
    j. a second addition means receiving the outputs of said first adding means and said first subtracting means to produce terms representing digital samples of the desired filtered signal.

5. A filtering device for filtering a signal $x(t)$ appearing in the form of consecutive digitally represented samples, $x_n$, said device being characterized in that it includes:
    a. an input means to which the stream of samples $x_n$ is applied,
    b. means for separating said stream into sample blocks of a constant length, c. a first addition means for adding together the corresponding samples belonging to two consecutive blocks,
d. a first subtraction means for subtracting from a sample the corresponding sample of the next earlier block,
e. a first transform device performing a normal DFT type transform and receiving the output terms from said first addition means,
f. a second transform device performing a modified DFT type transform and receiving the output terms from said first subtraction means,
g. a first storage means for storing the normal transform of a set of coefficients defining the desired filtering function,
h. a second storage means storing the modified transforms of said set of coefficients,
i. a first multiplication means connected to said first transform device and said first storage means for multiplying term-by-term the stored terms from said first storage means with the corresponding terms produced by said first transform device,
j. a second multiplying means connected to said second transform device and said second storage means for multiplying term-by-term the stored terms from said second storage means with the corresponding terms produced by said second transform device,
k. an inverse transform device connected to the output of said first multiplying means to perform the normal inverse DFT transform on the output terms of said first multiplier,
l. a second inverse transform device connected to the output of said second multiplying means to perform the modified inverse DFT transform on the output terms of said second multiplier, and
m. a second adding device connected to the outputs of both said inverse transform devices to sum the corresponding output terms to provide output terms representing samples of a desired filtered signal.

6. A filtering device for filtering a signal $x(t)$ which appears in the form of a stream of digitally represented samples, $x_n$, said filtering device including:
a. an input means receiving said stream of signals in blocks of samples of a constant length,
b. a pair of discrete transform generators connected to said input means, one generator generating a first normal DFT type transform and the other generating a modified DFT type transform on said blocks of samples,
c. a storage means for storing both the normal transform and the same modified transform of a set of filter coefficients defining the desired filtering function,
d. a first multiplication means connected to said one generator and said storage means for multiplying term-by-term the terms supplied by said one discrete transform generator and said normal transform coefficients,
e. a second multiplication means connected to said other generator and said storage means for multiplying term-by-term, the terms supplied by said other discrete transform generator and said modified transform coefficients,
f. a first delay means connected to the output of said first multiplication means,
g. a first addition means for adding together the input and output of said first delay means,
h. a second delay means connected to the output of said second multiplication means,
i. a subtraction means for subtracting the output of said second delay means from its input,
j. an inverter connected to the output of said subtraction means,
k. a second addition means having one input connected to the output of said first addition means,
l. a switch to alternately connect the other input of said second addition means to the input and output of said inverter, and
m. means connected to the output of said second addition means for generating an inverse DFT type transform of the output signals from said second addition means to produce signals representing digital samples of the filtered signal.

7. A filtering device for filtering a signal $x(t)$ appearing in the form of a stream of digitally represented samples, $x_n$, said filtering device including:
a. a splitting means for separating said stream into sample blocks of a constant length,
b. a switching means receiving said sample blocks and sending the even order samples in each block to a first input line and the odd order samples to a second input line,
c. a first transform generator for generating normal DFT type transforms of its input signals,
d. connection means for connecting said first input line to said first transform generator,
e. a second transform generator generating modified DFT type transforms of its input signals,
f. connecting means for connecting said second input line to said second transform generator,
g. an addition means connected to both of said transform generators to combine the outputs of said generators,
h. a subtraction means also connected to the outputs of both said transform generators to subtract the output terms of said modified DFT transform generator from the output of said first generator,
i. a storage means for storing both the normal transform and the same modified DFT transform of a set of filter coefficients defining a desired filtering function,
j. readout means for said storage means to provide said transformed coefficients,
k. a first multiplication means connected to said addition means and said readout means for multiplying term-by-term the normal transform terms supplied by said readout means with the corresponding terms of those supplied by said addition means,
l. a second multiplication means connected to said subtraction means and said readout means for multiplying term-by-term the modified transform terms supplied by said readout means with the corresponding terms of those supplied by said subtraction means,
m. a first delay means connected to the output of said first multiplication means,
n. a second addition means connected to the input and the output of said first delay means to combine the terms of said input and said output,
o. a second delay means connected to the output of said second multiplication means,
p. a second subtraction means connected to the input and the output of said second delay means to subtract the terms of said output from the corresponding terms of said input, q. an inverter connected to the output of said second subtraction means, r. a switch having an output and operated to connect its output alternately to the input and to the output of said inverter, s. a third addition means connected to the outputs of said second addition means and said switch for adding the output of said second addition means to that of said second subtraction means alternatively normal and inverted, and t. an inverse transform generating means connected to the output of said third addition means for generating an inverse DFT type transform of the terms provided by said third addition means to produce digital samples of the filtered signal.

8. A filtering device for filtering a signal $x(t)$ appearing in the form of a sequence of digitally represented samples $x_n$, said filtering device characterized in that it includes:

a. an input connection receiving said sequence of samples, b. a delay means connected to said input connection and operative to delay said samples for the time of N consecutive samples, where N is the number of samples in a block of samples to be processed as a unit, c. at least three circular convolution generators, each generator comprising:

$c_1$. a transform generator connected to said input connection and to the output of said delay means to perform a Fermat type transform operation on two consecutive blocks of said samples, each transform generator operating according to a different Fermat transform than the others, $c_2$. a multiplication device connected to the output of said transform generator, and $c_3$. an inverse transform generator connected to the output of said multiplication device and operating according to the inverse of the transform operation performed in its preceding transform generator, d. a storage device containing a block of filter coefficient terms for each of said circular convolution generators, each block being the filter coefficients for a desired filtering operation modified for the transform operation performed in the associated generator, e. a readout connection for each block of filter coefficients in said storage, said readout connection being connected to an input of said multiplication device in the associate circular convolution generator, and f. a combining device connected to the outputs of all said circular convolution generators and operating to produce two consecutive blocks of sample representations of a desired filtered signal.

* * * * *